United States Patent
Mori et al.

(10) Patent No.: US 8,735,729 B2
(45) Date of Patent: May 27, 2014

(54) DOUBLE-SIDED SUBSTRATE, SEMICONDUCTOR DEVICE AND METHOD FOR THE SAME

(75) Inventors: Shogo Mori, Aichi-ken (JP); Yoshitaka Iwata, Aichi-ken (JP)

(73) Assignee: Kabushiki Kaisha Toyota Jidoshokki, Aichi-ken (JP)

( * ) Notice: Subject to any disclaimer, the term of this patent is extended or adjusted under 35 U.S.C. 154(b) by 261 days.

(21) Appl. No.: 13/346,978

(22) Filed: Jan. 10, 2012

(65) Prior Publication Data
US 2012/0182692 A1    Jul. 19, 2012

(30) Foreign Application Priority Data
Jan. 13, 2011   (JP) ................................. 2011-005019

(51) Int. Cl.
*H05K 1/00*     (2006.01)
*H01L 23/373*   (2006.01)

(52) U.S. Cl.
CPC ................................. *H01L 23/3735* (2013.01)
USPC .......................................... 174/252; 361/704

(58) Field of Classification Search
CPC ................................................ H01L 23/3735
USPC .......... 174/252, 260; 361/697, 704, 709, 719, 361/720; 165/70, 80.3, 104.33, 185
See application file for complete search history.

(56) References Cited

U.S. PATENT DOCUMENTS

| | | | |
|---|---|---|---|
| 8,198,539 B2* | 6/2012 | Otoshi et al. ................. | 174/252 |
| 2004/0195294 A1* | 10/2004 | Masuda ..................... | 228/122.1 |
| 2006/0269670 A1* | 11/2006 | Lashmore et al. ......... | 427/249.1 |
| 2012/0113598 A1* | 5/2012 | Toh et al. .................... | 361/715 |
| 2013/0277034 A1* | 10/2013 | Iwata et al. ................ | 165/185 |

FOREIGN PATENT DOCUMENTS

JP    2009-065144 A    3/2009

* cited by examiner

*Primary Examiner* — Yuriy Semenenko
(74) *Attorney, Agent, or Firm* — Sughrue Mion, PLLC

(57) ABSTRACT

A double-sided substrate includes a ceramic substrate, a first metal layer formed on one surface of the ceramic substrate and having a plurality of subsidiary metal layers which are laminated on the surface of the ceramic substrate and whose purities differ from each other and a second metal layer formed on the other surface of the ceramic substrate, wherein the closer to the ceramic substrate any subsidiary metal layer is located, the lower purity the subsidiary metal layer has. Additionally, a semiconductor includes the above double-sided substrate, a power element and a heat sink.

9 Claims, 4 Drawing Sheets

DOUBLE-SIDED SUBSTRATE, SEMICONDUCTOR DEVICE AND METHOD FOR THE SAME

BACKGROUND OF THE INVENTION

The present invention relates to a double-sided substrate including a ceramic substrate and metal layers formed on surfaces on the opposite sides of the ceramic substrate. The present invention relates also to a semiconductor device including the double-sided substrate and a method for manufacturing the semiconductor device.

A semiconductor device is known which includes a double-sided substrate having mounted thereon a semiconductor element and a heat sink which is joined to the double-sided substrate for allowing heat generated by the semiconductor element to be released to the heat sink through the double-sided substrate. The double-sided substrate includes a ceramic substrate, a metal layer formed on one side of the double-sided substrate and forming a wiring layer and another metal layer formed on the other side of the double-sided substrate and forming a joining layer. The semiconductor device is formed in such a way that the semiconductor element is joined to the wiring layer of the double-layer substrate and the heat sink is joined to the joining layer.

For accomplishing a good joint between the ceramic substrate and the metal layer of such semiconductor device under heat cycle, Japanese Patent Application Publication 2009-65144 discloses a semiconductor device including a joining layer made of laminated aluminum layers whose aluminum purities differ from each other.

More particularly, in the joining layer of the above Publication, the aluminum layer joined to the ceramic substrate is made of aluminum whose purity is 99.99 wt % or more (or 4N—Al) and the other aluminum layer joined to the heat sink is made of aluminum whose purity is 99.5 wt % or more, but less than 99.9 wt % (or 2N—Al). The hardness (or the strength) of 4N—Al is lower than that of 2N—Al and, therefore, the aluminum layer joined to the ceramic substrate tends to be warped easily due to heat stress generated under the heat cycle and may be separated from the ceramic substrate.

The present invention is directed to providing a double-sided substrate which has improved joint strength between a ceramic substrate and a metal layer, a semiconductor device including such double-sided substrate and a manufacturing method for the semiconductor device.

SUMMARY OF THE INVENTION

A double-sided substrate includes a ceramic substrate, a first metal layer formed on one surface of the ceramic substrate and having a plurality of subsidiary metal layers which are laminated on the surface of the ceramic substrate and whose purities differ from each other and a second metal layer formed on the other surface of the ceramic substrate, wherein the closer to the ceramic substrate any subsidiary metal layer is located, the lower purity the subsidiary metal layer has. Additionally, a semiconductor includes the above double-sided substrate, a power element and a heat sink.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF THE PREFERRED EMBODIMENTS

Figure 1:
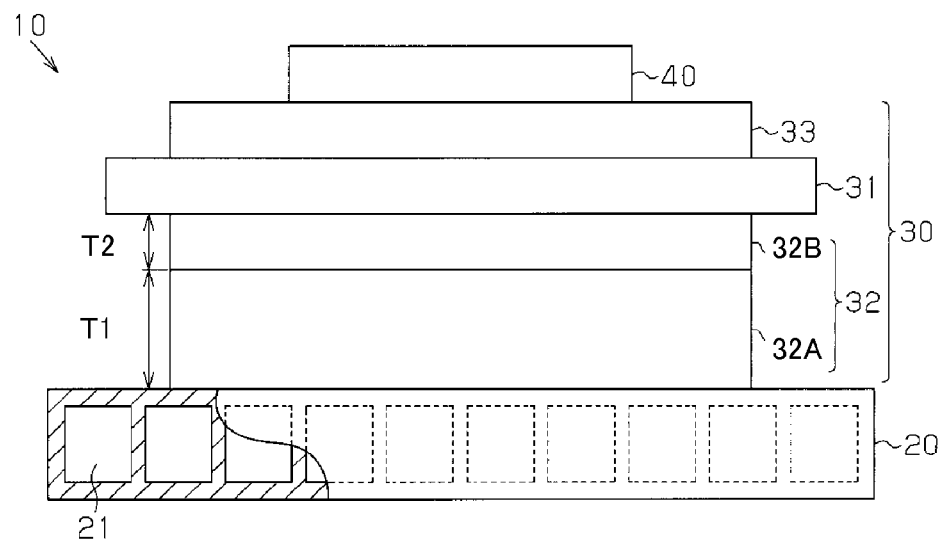
FIG. 1 is a front view of a power module according to a preferred embodiment of the present invention.

The following will describe a power module as a semiconductor device according to the embodiments of the present invention with reference to FIGS. 1 through 5. Referring to FIG. 1, the power module which is designated by 10 includes a double-sided substrate 30 and an aluminum heat sink 20 that is formed in the shape of a plate and fixed to the bottom surface of the double-sided substrate 30. More particularly, the double-sided substrate 30 includes a ceramic substrate 31, a first aluminum layer 32 as the first metal layer of the present invention formed on the lower surface of the ceramic substrate 31 and a second aluminum layer 33 (or wiring layer) as the second metal layer of the present invention formed on the upper surface of the ceramic substrate 31. The ceramic substrate is made of an aluminum nitride (or AlN).

The first aluminum layer 32 includes a plurality of subsidiary aluminum layers, namely the subsidiary aluminum layer 32A disposed on the heat sink 20 side of the first aluminum layer 32 and the subsidiary aluminum layer 32B disposed on the ceramic substrate 31 side of the first aluminum layer 32 and laminated on the subsidiary aluminum layer 32A. The subsidiary aluminum layer corresponds to the subsidiary metal layer of the present invention. The purity of aluminum of the subsidiary aluminum layer 32A on the heat sink 20 side of the first aluminum layer 32 differs from that of the subsidiary aluminum layer 32B on the ceramic substrate 31 side of the first aluminum layer 32. More particularly, the purity of aluminum of the subsidiary aluminum layer 32A (on the heat sink 20 side) is 99.99 wt % or more (or 4N—Al) and the purity of aluminum of the subsidiary aluminum layer 32B (on the ceramic substrate 31 side) is 99.5 wt % or more but less than 99.9 wt % (or 2N—Al). The hardness (or strength) of the subsidiary aluminum layer 32B on the ceramic substrate 31 side is lower than that of the subsidiary aluminum layer 32A on the heat sink 20 side.

Additionally, the thickness T1 of the subsidiary aluminum layer 32A on the heat sink 20 side is larger than that of the subsidiary aluminum layer 32B on the ceramic substrate 31 side. For example, the subsidiary aluminum layer 32A on the heat sink 20 side and the subsidiary aluminum layer 32B on the ceramic substrate 31 side are formed with thicknesses of 0.5-3.0 mm thick and 0.2-0.6 mm thick, respectively.

The first aluminum layer 32 is joined to the lower surface of the ceramic substrate 31 in such a way that the subsidiary aluminum layer 32A on the heat sink 20 side and the subsidiary aluminum layer 32B on the ceramic substrate 31 side form the lower layer and the upper layer of the first aluminum layer 32, respectively. The first aluminum layer 32 functions as the joint layer for joining the ceramic substrate 31 and the heat sink 20.

The power module 10 further includes a power element 40 as a semiconductor element which is soldered to the upper surface of the second aluminum layer 33. Thus, the heat sink 20 is thermally connected to the power element 40 through the double-sided substrate 30. The heat sink 20 has formed therein a plurality of parallel coolant passages 21 through which cooling water flows. During operation of the power module 10, heat is generated by the power element 40 and released to the heat sink 20 through the double-sided substrate 30.

Figure 2:
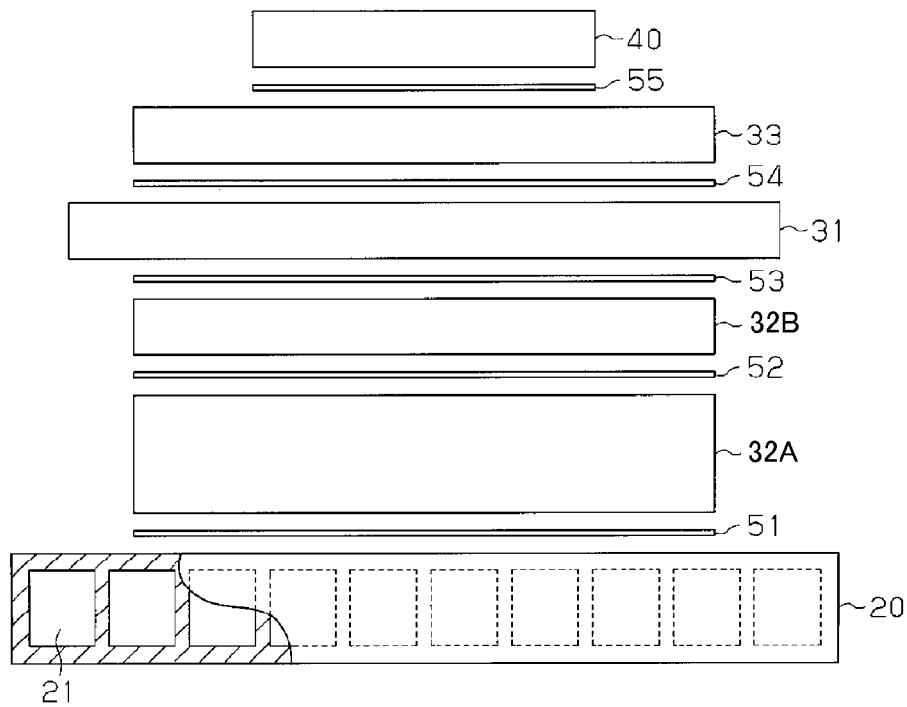
FIG. 2 is an exploded view illustrating the manufacturing method for the power module of FIG. 1.
Figure 3:
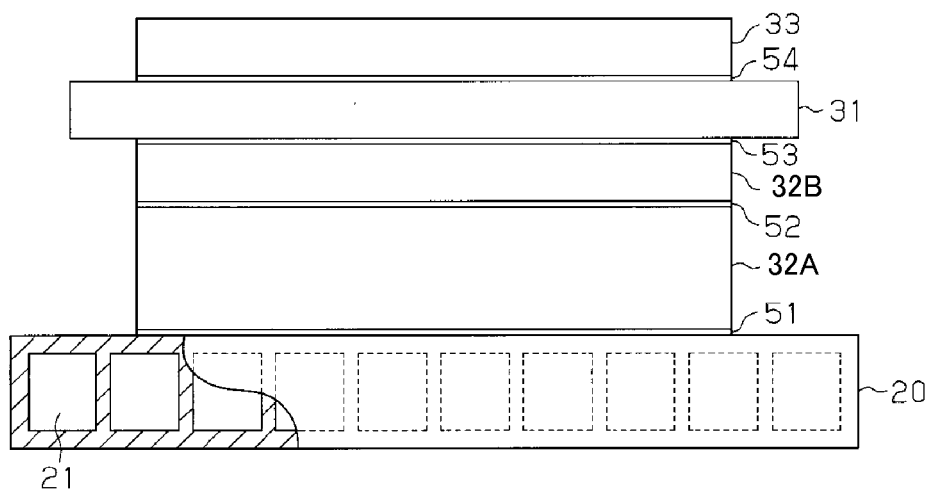
FIG. 3 is a front view illustrating the manufacturing method for the power module of FIG. 1.

The following will describe the manufacturing method for the power module 10 with reference to FIGS. 2 and 3. The heat sink 20, the ceramic substrate 31, the subsidiary aluminum layer 32A on the heat sink 20 side and the subsidiary aluminum layer 32B on the ceramic substrate 31 side cooperating to form the first aluminum layer 32 and the second aluminum layer 33 are joined together simultaneously by brazing.

More particularly, as shown in FIG. 3A, the subsidiary aluminum layer 32A is disposed on the upper surface of the heat sink 20 through aluminum brazing flux 51 and the subsidiary aluminum layer 32B is disposed on the upper surface of the subsidiary aluminum layer 32A through aluminum brazing flux 52.

Next, the ceramic substrate 31 is disposed on the upper surface of the subsidiary aluminum layer 32B through aluminum brazing flux 53 and the second aluminum layer 33 is disposed on the upper surface of the ceramic substrate 31 through aluminum brazing flux 54. The stack thus formed is heated in the furnace so that the aluminum brazing fluxes 51 through 54 melt. Then, the stack is placed under a room temperature to be brazed together.

Next, the power element 40 is joined to the upper surface of the second aluminum layer 33 through solder 55 (FIG. 2) by soldering. Consequently, the assembling of the power module 10 is completed.

Figure 5A:
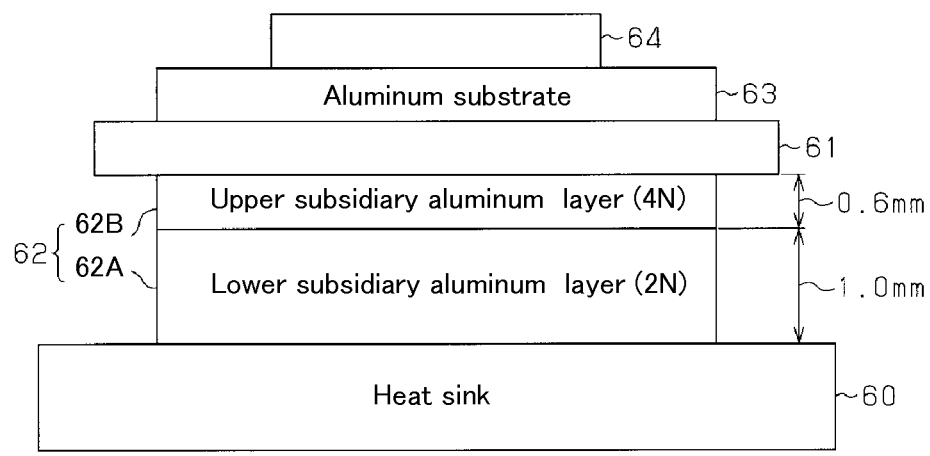
FIG. 5A is a front view of a semiconductor device according to a prior art.
Figure 5B:
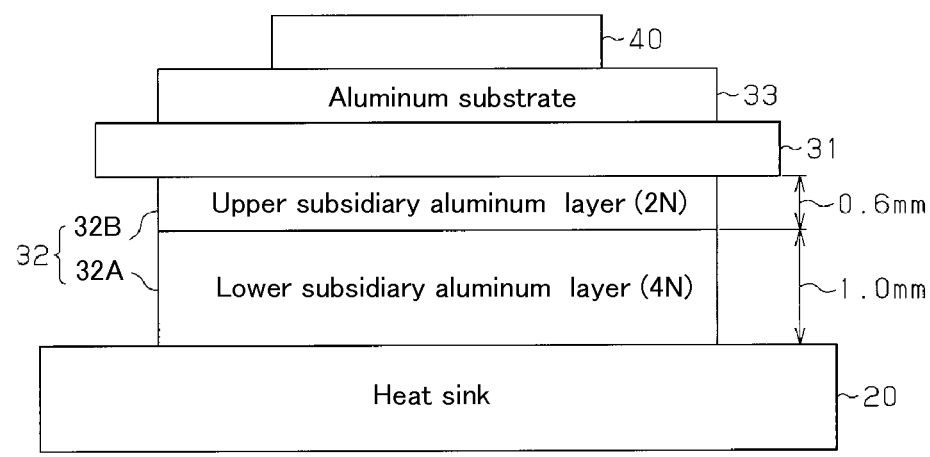
FIG. 5B is a front view of a semiconductor device according to a preferred embodiment of the present invention.

The following will describe the difference in the structure of semiconductor device between the prior art and the embodiment with reference to FIGS. 5A and 5B according to the results from the structure analysis. In the structure shown in FIG. 5A of prior art, the aluminum layer 62 (or the first aluminum layer) between the ceramic substrate 61 and the heat sink 60 includes the upper subsidiary aluminum layer 62B (or 4N—Al) that is 0.6 mm thick and the lower subsidiary aluminum layer 62A (or 2N—Al) that is 1.0 mm thick.

On the other hand, in the structure of semiconductor device shown in FIG. 5B of the embodiment of the present invention, the first aluminum layer 32 between the ceramic substrate 31 and the heat sink 20 includes the upper subsidiary aluminum layer 32B (or 2N—Al) that is 0.6 mm thick and the lower subsidiary aluminum layer 32A (or 4N—Al) that is 1.0 mm thick.

The rest of the structure of the semiconductor device according to the prior art is substantially the same as that according to the embodiment of the present invention. The following will describe the results of the structure analysis performed for the respective semiconductor devices of the prior art and the present embodiment. For the sake of convenience of explanation, the magnitude of warp in the semiconductor device according to the prior art is represented by "1.0". The magnitude of warp of the semiconductor device shown in FIG. 5B according to the embodiment of the present invention was "0.22". That is, the magnitude of warp of the power module according to the embodiment was reduced by 78% in comparison to that according to the prior art.

As is apparent from the above comparison, the joint reliability in the structure of the semiconductor device according to the embodiment of the present invention is improved as compared with that according to the prior art. The structure of the semiconductor device according to the embodiment of the present invention offers the following advantageous effects.

(1) The first aluminum layer 32 includes the subsidiary aluminum layer 32B disposed on the ceramic substrate 31 side of the first aluminum layer 32 and the subsidiary aluminum layer 32A disposed on the heat sink 20 side of the first aluminum layer 32, wherein the subsidiary aluminum layer 32B disposed on the ceramic substrate 31 side is made of aluminum whose purity is lower than that of the subsidiary aluminum layer 32A disposed on the heat sink 20 side. In other words, the hardness (or strength) of the subsidiary aluminum layer 32B made of aluminum (2N—Al), disposed on the ceramic substrate 31 side and joined to the ceramic substrate 31 by aluminum brazing is higher than that of the subsidiary aluminum layer 32A disposed on the heat sink 20 side. Therefore, the subsidiary aluminum layer 32B on the ceramic substrate 31 side is less subject to being warped and separated from the ceramic substrate 31 under heat cycle. Additionally, the subsidiary aluminum layer 32A on the heat sink 20 side serves as a cushion member thereby to reduce the heat stress exerted on the ceramic substrate 31. Thus, the joint strength between the ceramic substrate 31 and the subsidiary aluminum layer 32B on the ceramic substrate 31 side of the first aluminum layer 32 under heat cycle is improved.

(2) The heat sink 20 is made of an aluminum alloy. The subsidiary aluminum layer 32A on the heat sink 20 side of the first aluminum layer 32 and the heat sink 20 are made of the same kind of material, so that the joint strength between the subsidiary aluminum layer 32A on the heat sink 20 side and the heat sink 20 is improved.

(3) The double-sided substrate 30 and the heat sink 20 can be joined simultaneously by brazing.

The present invention is not limited to the above embodiment, but it may be modified into various alternative embodiments, as exemplified below.

Figure 4:
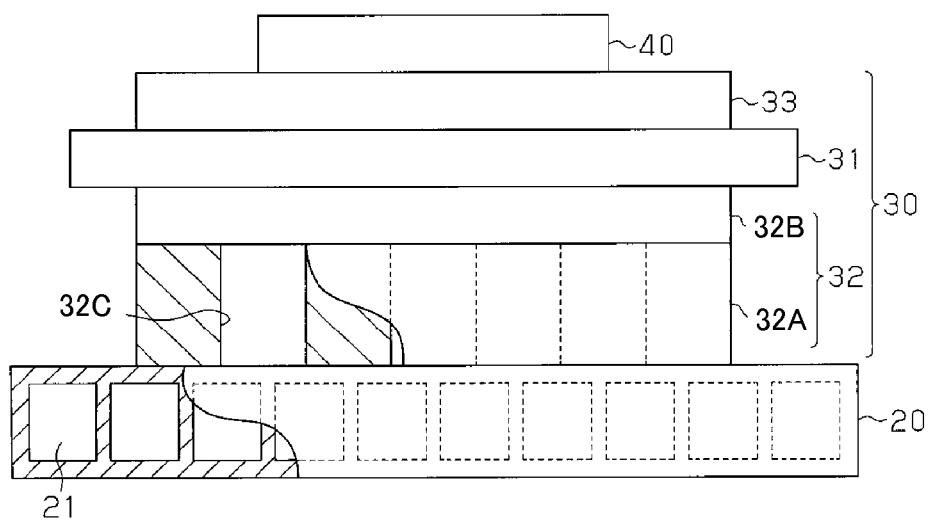
FIG. 4 is a front view of a power module according to an alternative embodiment of the present invention.

As shown in FIG. 4, a hole 32C (or a recess) may be formed through the subsidiary aluminum layer 32A on the heat sink 20 side of the first aluminum layer 32. The provision of such hole 32C in the subsidiary aluminum layer 32A helps to reduce the heat stress exerted on the ceramic substrate 31, thereby improving the joint strength of the semiconductor device. A hole (or a recess) may be formed through the subsidiary aluminum layer 32B on the ceramic substrate 31 side of the first aluminum layer 32.

Figure 6:
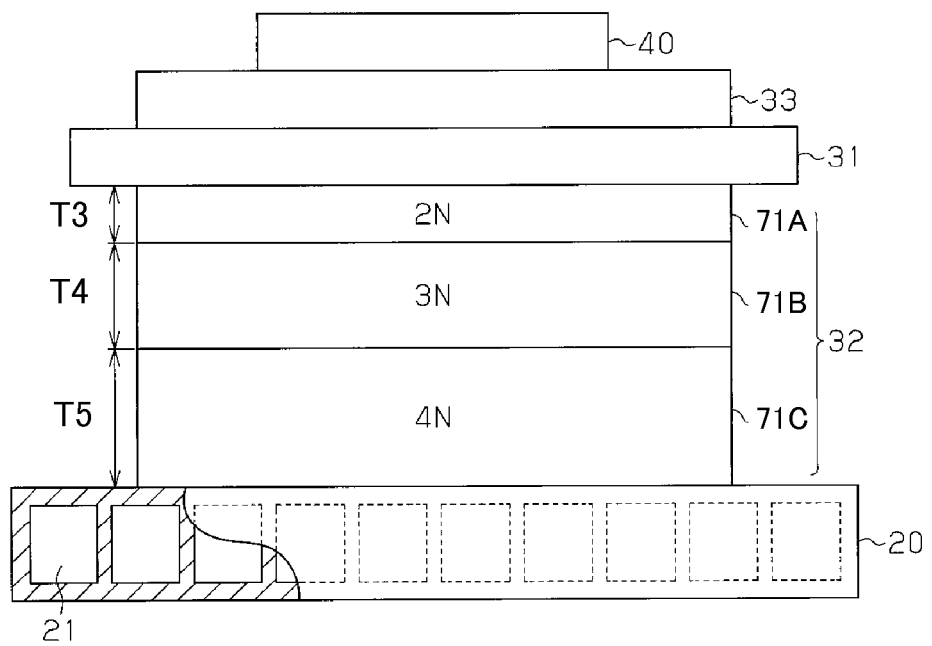
FIG. 6 is a front view of a power module according to another alternative embodiment of the present invention.

The first aluminum layer 32 may include three subsidiary aluminum layers or more, as shown in FIG. 6. The subsidiary aluminum layer corresponds to the subsidiary metal layer of the present invention. In this case, the closer to the ceramic substrate 31 any subsidiary aluminum layer is located, the lower purity of aluminum and the smaller thickness the subsidiary aluminum layer needs to have. For example, the first aluminum layer 32 may include three subsidiary aluminum layers, namely a subsidiary aluminum layer 71A made of 2N—Al, a subsidiary aluminum layer 71B made of 3N—Al and a subsidiary aluminum layer 71C made of 4N—Al that are laminated in this order as seen from the lower surface of the ceramic substrate 31. The thickness T3, T4, T5 of the respective aluminum layers made of 2N—Al, 3N—Al, 4N—Al are increased in this order. This structure improves the joint strength between the ceramic substrate 31 and the first aluminum layer 32 and the heat stress is reduced by the subsidiary aluminum layer 71C that is made of 4N—Al.

Alcohol and the like may be used as the coolant flowing through the coolant passages 21 of the heat sink 20. The heat sink 20 of the power module 10 may be of an air-cooling type releasing heat to the atmosphere.

The plurality of metal layers forming the first metal layer and having different purities may be made of copper instead of aluminum.

The heat sink 20 may be made of copper.

What is claimed is:

1. A double-sided substrate comprising:
a ceramic substrate;
a first metal layer formed on one surface of the ceramic substrate and having a plurality of subsidiary metal layers which are laminated on the surface of the ceramic substrate and whose purities differ from each other; and
a second metal layer formed on the other surface of the ceramic substrate, wherein the closer to the ceramic substrate any subsidiary metal layer is located, the lower purity the subsidiary metal layer has.

2. The double-sided substrate according to claim 1, wherein the higher purity any subsidiary metal layer has, the larger thickness the subsidiary metal layer has.

3. The double-sided substrate according to claim 1, wherein the subsidiary metal layer closer to the ceramic substrate is formed with thickness of 0.2-0.6 mm and the subsidiary metal layer far from the ceramic substrate is formed with thickness of 0.5-3.0 mm.

4. The double-sided substrate according to claim 1, wherein the subsidiary metal layer has a hole.

5. The double-sided substrate according to claim 1, wherein the subsidiary metal layers are made of aluminum, wherein the purity of aluminum of the subsidiary metal layer having the lowest purity among the subsidiary metal layers is 99.5 wt % or more, but less than 99.9 wt %, wherein the purity of aluminum of the subsidiary metal layer having the highest purity among the subsidiary metal layers is 99.99 wt % or more.

6. The double-sided substrate according to claim 1, wherein the first and the second metal layers are made of copper.

7. A semiconductor device, wherein the semiconductor device comprising:
a double-sided substrate including:
a ceramic substrate;
a first metal layer formed on one surface of the ceramic substrate and having a plurality of subsidiary metal layers which are laminated on the surface and whose purities differ from each other, wherein the closer to the ceramic substrate any subsidiary metal layer is located, the lower purity the subsidiary metal layer has; and
a second metal layer formed on the other surface of the ceramic substrate,
a power element; and
a heat sink.

8. The semiconductor device according to claim 7, wherein the heat sink is made of the same kind of material as the first and the second metal layers.

9. A method of manufacturing a semiconductor device including a ceramic substrate, a plurality of subsidiary metal layers forming a first metal layer, a second metal layer, a heat sink and a power element, wherein purities of the plurality of subsidiary metal layers differ from each other, wherein the closer to the ceramic substrate any subsidiary metal layer is located, the lower purity the subsidiary metal layer has, comprising the steps of:
joining the ceramic substrate, the plurality of subsidiary metal layers forming the first metal layer, the second metal layer and the heat sink simultaneously by brazing in a first manufacturing process; and
joining the power element to the second metal layer by soldering in a second manufacturing process.

\* \* \* \* \*